United States Patent
Nishimura et al.

(10) Patent No.: US 7,033,726 B2
(45) Date of Patent: Apr. 25, 2006

(54) PHOTORESIST POLYMERIC COMPOUND AND PHOTORESIST RESIN COMPOSITION

(75) Inventors: Masamichi Nishimura, Himeji (JP); Hiroshi Koyama, Himeji (JP); Kiyoharu Tsutsumi, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 0 days.

(21) Appl. No.: 10/494,686

(22) PCT Filed: Oct. 28, 2003

(86) PCT No.: PCT/JP03/13744

§ 371 (c)(1),
(2), (4) Date: May 5, 2004

(87) PCT Pub. No.: WO2004/041881

PCT Pub. Date: May 21, 2004

(65) Prior Publication Data

US 2005/0014087 A1 Jan. 20, 2005

(30) Foreign Application Priority Data

Nov. 5, 2002 (JP) ............................ 2002-321755

(51) Int. Cl.
*G03F 7/004* (2006.01)
*G03F 7/30* (2006.01)

(52) U.S. Cl. .................. 430/270.1; 430/311; 430/326; 430/905; 430/910

(58) Field of Classification Search ............ 430/270.1, 430/905, 910, 326, 311
See application file for complete search history.

(56) References Cited

U.S. PATENT DOCUMENTS

| | | | | |
|---|---|---|---|---|
| 4,065,488 A | * | 12/1977 | Chou et al. | ................. 549/464 |
| 4,252,886 A | * | 2/1981 | Himics et al. | ........... 430/270.1 |
| 4,293,475 A | * | 10/1981 | Sidi | ......................... 523/410 |
| 4,297,286 A | * | 10/1981 | Sandrock et al. | .......... 549/464 |
| 5,910,286 A | * | 6/1999 | Lipskier | ...................... 422/68.1 |
| 2004/0232383 A1 | * | 11/2004 | Imamoto et al. | ......... 252/299.7 |

FOREIGN PATENT DOCUMENTS

| | | |
|---|---|---|
| JP | 9-73173 A | 3/1997 |
| JP | 2000-26446 A | 1/2000 |
| JP | 2001-302728 A | 10/2001 |
| JP | 2001-323125 A | 11/2001 |
| JP | 2002-311590 A | 10/2002 |
| JP | 20044240387 A | * 8/2004 |
| JP | 2004333925 A | * 11/2004 |
| JP | 2004341062 A | * 12/2004 |
| JP | 20044341061 A | * 12/2004 |

\* cited by examiner

*Primary Examiner*—John S. Chu
(74) *Attorney, Agent, or Firm*—Birch, Stewart, Kolasch & Birch, LLP

(57) ABSTRACT

A polymeric compound for photoresist of the present invention includes a monomer unit having 2,6-dioxabicyclo[3.3.0]octane skeleton in the structure. The monomer unit having 2,6-dioxabicyclo[3.3.0]octane skeleton includes a monomer unit represented by the following Formula (I):

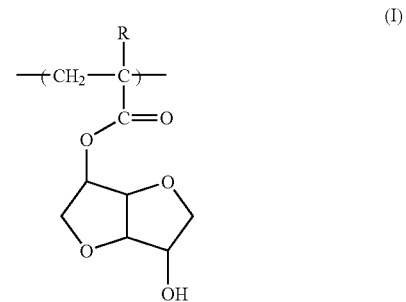

wherein R is a hydrogen atom or a methyl group. The polymeric compound for photoresist may include a monomer unit having 2,6-dioxabicyclo[3.3.0]octane skeleton, a monomer unit having a group of adhesion to substrate, and a monomer unit having an acid-eliminating group. The polymeric compound for photoresist of the present invention exhibits not only adhesion to substrate, acid-eliminating property and resistance to dry-etching but also has well-balanced solubility in solvents for photoresist and alkali-soluble property.

6 Claims, No Drawings

PHOTORESIST POLYMERIC COMPOUND AND PHOTORESIST RESIN COMPOSITION

TECHNICAL FIELD

The present invention relates to a polymeric compound for photoresist for use in microprocessing of semiconductor, to a resin composition for photoresist containing the polymeric compound, and to a process for producing a semiconductor

BACKGROUND ART

A photoresist resin used in a process for producing a semiconductor is in need of a part exhibiting adhesion to substrate such as silicon wafers and a part becoming soluble in an alkali-developer by being eliminated by action of an acid generated from a photosensitive acid generator with exposure. Further, a photoresist resin is in need of having resistance to dry etching.

In Japanese Unexamined Patent Application Publications No. 2000-026446, an alicyclic hydrocarbon skeleton having a lactone skeleton is described as a structure which gives adhesion to a substrate and has resistance to dry-etching. Further, in Japanese Unexamined Patent Application Publications No. 1997-073137, an alicyclic hydrocarbon skeleton having a tertiary carbon atom is proposed as a structure which gives acid-eliminating property and has resistance to dry-etching. Therefore, co-polymerizing monomers having such two skeletons can provide a polymer integrating functions needed for a photoresist resin. The co-polymer has adhesion to substrate, acid-eliminating property and resistance to dry-etching, but its polarity is so low because of having an alicyclic hydrocarbon skeleton that the co-polymer is hard to dissolve in a photoresist solvent and in an alkali-developer after exposure, and other problems can be occurred. Such properties of co-polymer are out of balance as a photoresist resin.

DISCLOSURE OF INVENTION

An object of the present invention is to provide a polymeric compound for photoresist which exhibits not only adhesion to substrate, acid-eliminating property and resistance to dry-etching but also has well-balanced solubility in solvents for photoresist and alkali-soluble property, and a resin composition for photoresist containing the polymeric compound for photoresist.

Another object of the present invention is to provide a polymeric compound for photoresist, a resin composition for photoresist and a process for producing a semiconductor which can accurately form a fine pattern.

The present inventors made intensive investigations to find that a polymeric compound for photoresist which exhibits not only adhesion to substrate, acid-eliminating property and resistance to dry-etching but also has well-balanced solubility in solvents for photoresist and alkali-soluble property can be obtained by using a monomer having a specific structure as a co-monomer for a polymeric compound for photoresist. The present invention has been achieved based on these findings.

Specifically, the present invention provides a polymeric compound for photoresist, including a monomer unit having 2,6-dioxabicyclo[3.3.0]octane skeleton in the structure.

A typical example of the monomer unit having 2,6-dioxabicyclo[3.3.0]octane skeleton is a monomer unit represented by the following Formula (I):

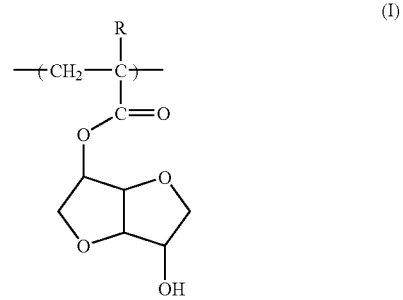

(I)

wherein R is a hydrogen atom or a methyl group.

The polymeric compound for photoresist includes a polymeric compound comprising a monomer unit having 2,6-dioxabicyclo[3.3.0]octane skeleton, a monomer unit having a group of adhesion to substrate, and a monomer unit having an acid-eliminating group.

Alternatively, the polymeric compound for photoresist includes a polymeric compound including (A) a monomer unit having 2,6-dioxabicyclo[3.3.0]octane skeleton, (B) a monomer unit corresponding to a (meth)acrylic acid ester wherein an alicyclic hydrocarbon group having 6 to 20 carbon atoms including a lactone ring is combined with an oxygen atom constituting the ester, and (C) a monomer unit corresponding to a (meth)acrylic acid ester having an alicyclic hydrocarbon group having 6 to 20 carbon atoms and a group which can leave by action of an acid.

In addition, the polymeric compound for photoresist includes a polymeric compound including (A) a monomer unit having 2,6-dioxabicyclo[3.3.0]octane skeleton, (B1) at least one selected from monomer units represented by the following Formulae (IIa) thorough (IIe):

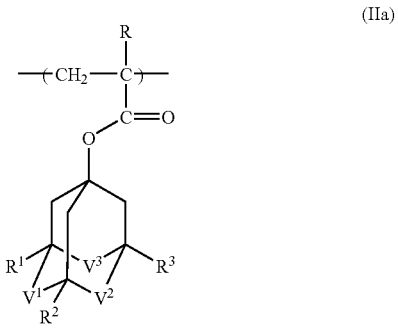

(IIa)

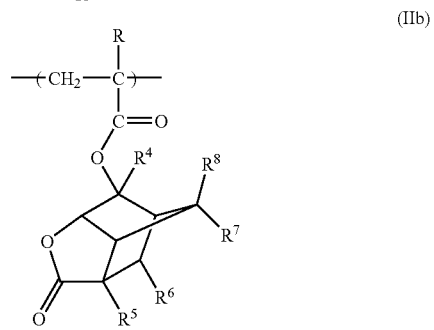

(IIb)

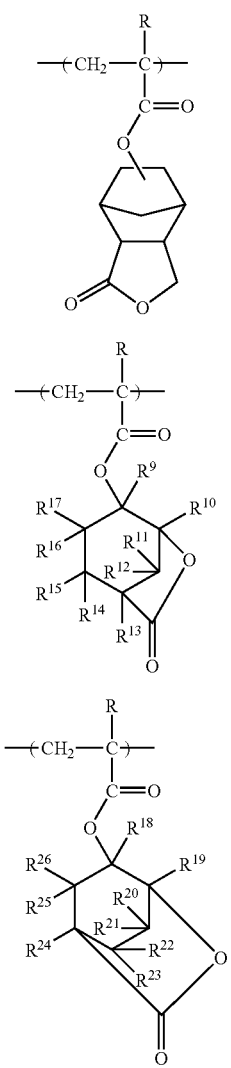

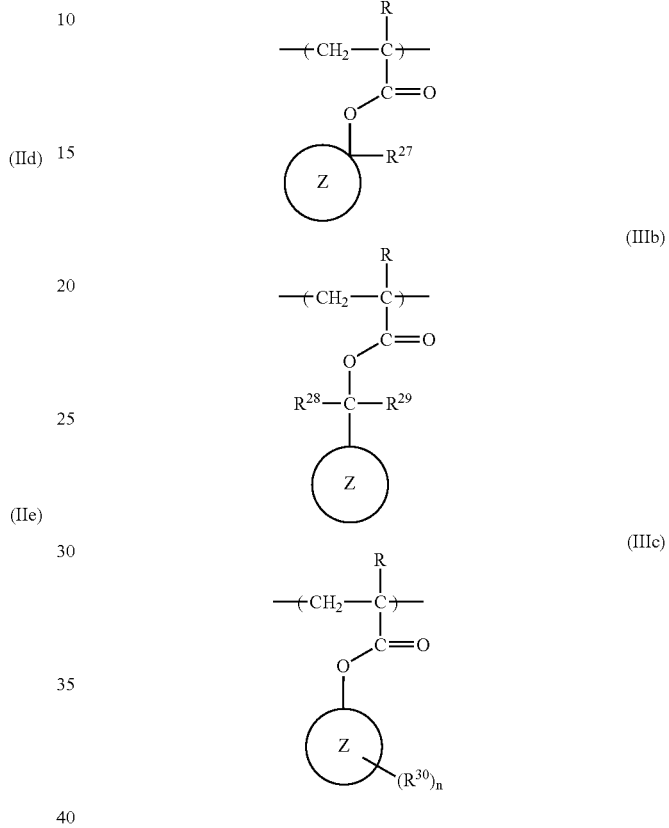

wherein R is a hydrogen atom or a methyl group; $R^1$, $R^2$ and $R^3$ are identical to or different from and are each a hydrogen atom, an alkyl group, a hydroxyl group which may be protected by a protecting group, a hydroxyalkyl group which may be protected by a protecting group or a carboxyl group which may be protected by a protecting group, and each of $V^1$, $V^2$ and $V^3$ are identical to or different from and are each —$CH_2$—, —CO— or —COO—, where at least one of $V^1$, $V^2$ and $V^3$ is —COO—; $R^4$, $R^5$, $R^6$, $R^7$ and $R^8$ are identical to or different from and are each a hydrogen atom, an alkyl group, a hydroxyl group which may be protected by a protecting group, a hydroxyalkyl group which may be protected by a protecting group or a carboxyl group which may be protected by a protecting group; each of $R^9$, $R^{10}$, $R^{11}$, $R^{12}$, $R^{13}$, $R^{14}$, $R^{15}$, $R^{16}$ and $R^{17}$ are identical to or different from and are each a hydrogen atom, an alkyl group, a hydroxyl group which may be protected by a protecting group, a hydroxyalkyl group which may be protected by a protecting group or a carboxyl group which may be protected by a protecting group; each of $R^{18}$, $R^{19}$, $R^{20}$, $R^{21}$, $R^{22}$, $R^{23}$, $R^{24}$, $R^{25}$ and $R^{26}$ are identical to or different from and are each a hydrogen atom, an alkyl group, a hydroxyl group which may be protected by a protecting group, a hydroxyalkyl group which may be protected by a protecting group or a carboxyl group which may be protected by a protecting group, and (C1) at least one monomer unit selected from among a monomer unit represented by the following Formulae (IIIa) through (IIIc):

wherein a ring Z is an alicyclic hydrocarbon ring of 6 to 20 carbon atoms; R is a hydrogen atom or a methyl group; each of $R^{27}$, $R^{28}$ and $R^{29}$ are identical to or different from and are each an alkyl group of 1 to 6 carbon atoms; $R^{30}$ which is a group bound to the ring Z is identical to or different from an oxo group, an alkyl group, a hydroxyl group which may be protected by a protecting group, a hydroxyalkyl group which may be protected by a protecting group or a carboxyl group which may be protected by a protecting group where least one of $nR^{30}$ s is a group of —$COOR^a$, wherein the $R^a$ is a tertiary hydrocarbon group which may have a substituent, a tetrahydrofuranyl group, a tetrahydropyranyl group or an oxepanyl group; n denotes an integer of 1 to 3.

Further, the present invention provides a resin composition for photoresist, including at least the polymeric compound for photoresist and a photosensitive acid generator.

In addition, the present invention provides a process for fabricating a semiconductor, the process comprising the steps of applying the resin composition for photoresist to a base or a substrate to form a resist film, exposing, developing and thereby patterning the resist film.

The polymeric compound for photoresist of the present invention exhibits not only adhesion to substrate, acid-eliminating property and resistance to dry-etching but also well-balanced solubility in solvents for photoresist and alkali-soluble property because it includes a monomer unit having a specific structure. Therefore, by using a resin composition for photoresist containing the polymeric compound for production of a semiconductor, a fine pattern can be accurately formed.

In the present description, the terms "acrylic" and "methacrylic" may generically be referred to as "(meth)acrylic", and the terms "acryloyl" and "methacryloyl" may generically be referred to as "(meth)acryloyl". Further, as the protecting groups each of a hydroxyl group, a carboxyl group and others, those conventionally used in the field of organic synthesis can be used.

BEST MODE FOR CARRYING OUT THE INVENTION

The polymeric compound for photoresist of the present invention comprises a monomer unit having 2,6-dioxabicyclo[3.3.0]octane skeleton in the structure of polymer. By introducing such a monomer unit into the structure of polymer, even if a low-polarity monomer is used as a monomer unit which provides properties such as adhesion to substrate, acid-eliminating property and resistance to dry-etching, a solubility of the polymer in a photoresist solvent and a solubility in alkali-developer can be improved without spoiling the properties. Therefore, a preparation of photoresist resin composition and a production of semiconductor can be performed smoothly with ease of operation.

2,6-dioxabicyclo[3.3.0]octane skeleton may be bound to a principle chain directly or via an appropriate linkage group. The linkage group includes, for example, an ester group (—COO—), an amide group (—CONH—), a ether bond (—O—), a carbonyl group (—CO—), an alkylene group (methylene,. ethylene, propylene, a trimethylene group, and other linear or branched-chain alkylene groups each having 1 to 6 carbon atoms) and groups comprising two or more of these groups combined with each other.

2,6-dioxabicyclo[3.3.0]octane skeleton may have a substituent. Examples of the said substituent are an oxo group, an alkyl group, a hydroxyl group which may be protected by a protecting group, a-hydroxyalkyl group which may be protected by a protecting group, and a carboxyl group which may be protected by a protecting group. The alkyl group includes, for example, methyl, ethyl, propyl, isopropyl, butyl, isobutyl, s-butyl, t-butyl, hexyl, octyl, decyl, dodecyl, and other linear or branched-chain alkyl groups each having 1 to 13 carbon atoms, of which $C_1$-$C_4$ alkyl groups are preferred. The hydroxyl group which may be protected by a protecting group includes, for example, a hydroxyl group, a substituted oxy group (e.g., methoxy, ethoxy, propoxy, and other $C_1$–$C_4$ alkoxy groups) and others. The hydroxyalkyl group which may be protected by a protecting group are groups bound to the hydroxyl group which may be protected by a protecting group via alkylene groups each having 1 to 6 carbon atoms and so on. The carboxyl group which may be protected by a protecting group includes a —COOR$^b$ group and others. The said R$^b$ is a hydrogen atom or an alkyl group, and the alkyl group includes methyl, ethyl, propyl, isopropyl, butyl, isobutyl, s-butyl, t-butyl, hexyl, and other linear or branched-chain alkyl groups each having 1 to 6 carbon atoms and so on. Preferred substituents 2,6-dioxabicyclo[3.3.0]octane skeleton may have are specifically a hydroxyl group which may be protected by a protecting group, a hydroxyalkyl group which may be protected by a protecting group and so on.

A typical example of the monomer unit having 2,6-dioxabicyclo[3.3.0]octane skeleton includes a monomer unit (a repeating unit) represented by the above Formula (I).

In a polymeric compound for photoresist of the present invention, a polymeric compound comprising a monomer unit having 2,6-dioxabicyclo[3.3.0]octane skeleton, a monomer unit having a group of adhesion to substrate, and a monomer unit having a acid-eliminating group have exceedingly well-balanced adhesion to substrate, acid-eliminating property, resistance to dry-etching, solubility in resist solvents, and alkali-solubility. Therefore, by producing semiconductor by using a photoresist resin composition containing such polymeric compound, a fine pattern can be accurately formed.

A monomer unit having a group of adhesion to substrate, it isn't particularly limited as long as they exhibits adhesion to substrate such as a silicon wafer, for example, a monomer unit (constitutional repeating unit in polymerization at the site of carbon-carbon double bond) corresponding to a (meth) acrylic acid ester where an alicyclic hydrocarbon group each having 6 to 20 carbon atoms and including lactone ring [e.g., a group having a structure comprising a lactone ring and mono- or poly- (bridged) alicyclic carbon ring condensed thereto]is bound to an oxygen atom constituting an ester bond, and others. Typical examples of such monomer unit are units represented by the above Formulae (IIa), (IIb), (IIc), (IId) and (IIe).

Further, as a monomer unit having a group of adhesion to substrate, a monomer unit (constitutional repeating unit in polymerization at the site of carbon-carbon double bond) corresponding to a (meth)acrylic acid ester where γ-butyrolactone ring or δ-valerolactone ring is bound to an oxygen atom constituting the ester bond can be also used. In addition, as a monomer unit having a group of adhesion to substrate, a monomer unit (constitutional repeating unit in polymerization at the site of carbon-carbon double bond) corresponding to a (meth) acrylic acid ester where a hydrocarbon group having a polar substituent is bound to an oxygen atom constituting the ester bond can be used, too. "The hydrocarbon group having a polar substituent" includes a hydroxyl group, an oxo group, a carboxyl group, an amino group, a sulfonic acid group, a substituted oxy group (e.g., methoxy, ethoxy, propoxy, and other $C_1$–$C_4$ alkoxy groups), and other hydrocarbon groups each having polar groups of one or more, preferably from about 1 to about 3 [e.g., $C_1$–$C_{20}$ aliphatic hydrocarbon groups, alicyclic hydrocarbon groups each having 3 to 20 membered mono- or poly-rings (bridged ring), aromatic hydrocarbon groups, and hydrocarbon group combined with plural these groups via a linkage group such as an oxygen atom, an ester bond, an amide bond or not]. The said polar group may be protected by a protecting group.

Monomer units having an acid-eliminating group are not specifically limited, as long as they leave by action of an acid generated from a photosensitive acid generator by exposure to exhibit solubility in alkali developer, for example, a monomer unit (constitutional repeating unit in polymerization at the site of carbon-carbon double bond) corresponding to (meth) acrylic acid ester having an alicyclic hydrocarbon group having 6 to 20 carbon atoms and also having a group which can leave by action of an acid. "The (meth) acrylic acid ester having an alicyclic hydrocarbon group having 6 to 20 carbon atoms and also having a group which can leave by action of an acid" includes (meth)acrylic acid esters each having an alicyclic hydrocarbon group having 6 to 20 carbon atoms and also having a tertiary carbon atom at the bonding site with the oxygen atom constituting an ester bond of the (meth)acrylic acid ester. The said alicyclic hydrocarbon group may be bound to an oxygen atom constituting an ester bond of (meth)acrylic acid ester directly or via a linkage group such as an alkylene group. The said alicyclic hydrocarbon group each having 6 to 20 carbon atoms may be a mono-cyclic hydrocarbon group or a poly-cyclic (bridged-cyclic) hydrocarbon group. Typical examples of the monomer unit corresponding to such (meth)acrylic acid esters are units represented by the said Formulae (IIIa) and (IIIb) In addition, "the (meth)acrylic acid ester having an alicyclic hydrocarbon group having 6 to 20 carbon atoms and also having a group which can leave by action of an acid" further includes (meth)acrylic acid esters each having an alicyclic hydrocarbon group having 6 to 20 carbon atoms and also having —COOR$^a$ group, wherein R$^a$ is a tertiary hydrocarbon group which may have a substituent, a tetrahydrofuranyl group, a tetrahydropyranyl group or an oxepanyl group, bound to the hydrocarbon group directly or via a linkage group. The tertiary hydrocarbon group in R$^a$ of the —COOR$^a$ group includes, for example, t-butyl, t-amyl, 2-methyl-2-adamantyl, (1-methyl-1-adamantyl)ethyl group, and others. The substituent the tertiary hydrocarbon group may have includes, for example, a halogen atom, an alkyl group (e.g., a $C_1$–$C_4$ alkyl group and others), a hydroxyl group which may be protected by a protecting group, an oxo group, a carboxyl group which may be protected by a protecting group and so on. Further, the tetrahydrofuranyl group in R$^a$ includes a 2-tetrahydrofuranyl group, the tetrahydropyranyl group includes a 2-tetrahydropyranyl, and the oxepanyl group includes a 2-oxepanyl group. The linkage group includes an alkylene group (e.g., a linear or branched-chain alkyl groups each having 1 to 6 carbon atoms and so on). The said alicyclic hydrocarbon group may be bound to an oxygen atom constituting an ester bond of (meth)acrylic acid ester directly or via a linkage group such as an alkylene group. The said alicyclic hydrocarbon group each having 6 to 20 carbon atoms may be a mono-cyclic hydrocarbon or a poly-cyclic (bridged cyclic) hydrocarbon group. As typical examples of such monomer units, the monomer units represented by the Formula (IIIc) are exemplified.

Further, as the repeating units each having an acid-eliminating group, a monomer unit (constitutional repeating unit in polymerization at the site of a carbon-carbon double bond) corresponding to a (meth) acrylic acid ester having a lactone ring, which have an oxygen atom constituting an ester bond combined with the rings at the beta-position and at least one hydrogen atom at the alpha-position can also be used.

A polymeric compound for photoresist of the present invention may include one or more repeating units having a group of adhesion to substrate and monomer units having an acid-eliminating group, respectively.

A preferred feature of a polymeric compound for photoresist of the present invention includes (A) a monomer unit having 2,6-dioxabicyclo[3.3.0]octane skeleton [e.g., a monomer unit represented by the Formula (I)], (B) a monomer unit corresponding to a (meth)acrylic acid ester, where an alicyclic hydrocarbon group having 6 to 20 carbon atoms having a lactone ring is combined with an oxygen atom constituting the ester bond, and (C) a monomer unit corresponding to a (meth) acrylic acid ester having an alicyclic hydrocarbon group having 6 to 20 carbon atoms and a group which can leave by action of an acid. Each of the monomer units (A), (B) and (C) may be used alone or in combination, respectively. Such polymeric compound for photoresist is particularly well-balanced properties such as adhesion to substrate, acid-eliminating property, resistance to dry-etching, solubility to a resist solvent and alkali-solubility.

In the polymeric compound for photoresist, the proportions of monomer units (A), (B) and (C) can appropriately be selected according to its combinations. The proportion of the monomer unit (A) is usually from about 1 to about 50% by mole, preferably from about 2 to about 40% by mole and more preferably from about 3 to about 30% by mole. The proportion of the monomer unit (B) is usually from about 1 to about 99% by mole, preferably from about 10 to about 95% by mole and more preferably from about 20 to about 85% by mole. The proportion of the monomer unit (C) is usually from about 1 to about 99% by mole, preferably from about 5 to about 80% by mole and more preferably from about 15 to about 70% by mole. The polymeric compound may include other monomer units in addition to monomer units (A), (B) and (C).

Another preferred feature of a polymeric compound for photoresist of the present invention includes (A) a monomer unit having 2,6-dioxabicyclo[3.3.0]octane skeleton [e.g., a monomer unit represented by the Formula (I)], (B1) at least one monomer unit selected from the following Formulae (IIa) through (IIe), and (C1) at least one monomer unit selected from the following Formulae (IIIa) through (IIIc). Such polymeric compound for photoresist are also extremely well-balanced properties such as adhesion to substrate, acid-eliminating property, resistance to dry-etching, solubility to a resist solvent and alkali-solubility. In addition, it is useful to improve resistance to dry-etching of a polymeric compound for photoresist, because the monomer units represented by the Formulae (IIa) through (IIe) and the Formulae (IIIa) through (IIIc) have an alicyclic hydrocarbon ring.

In the polymeric compound for photoresist, the proportion of monomer units (A), (B1) and (C1) can appropriately be selected according to each of combinations. The proportion of the monomer unit (A) is usually from about 1 to about 50% by mole, preferably from about 2 to about 40% by mole and more preferably about 3 to about 30% by mole. The proportion of the monomer unit (B1) is usually from about 1 to about 99% by mole, preferably from about 10 to about 95% by mole and more preferably from about 20 to about 85% by mole. The proportion of monomer unit (C1) is usually from about 1 to about 99% by mole, preferably from about 5 to about 80% by mole and more preferably from about 15 to about 70% by mole. The polymeric compound may include other monomer unit in addition to the monomer units (A), (B1) and (C1).

In the Formulae (IIa) through (IIe), alkyl groups represented by $R^1$ through $R^{26}$ includes, for example, methyl, ethyl, propyl, isopropyl, butyl, isobutyl, s-butyl, t-butyl, hexyl, octyl, decyl, dodecyl group, and other linear or branched-chain alkyl group each having 1 to 13 carbon atoms. In these groups, alkyl groups each having 1 to 4 carbon atoms are preferred. As the hydroxyl group which may be protected by a protecting group, there may be mentioned, for example, a hydroxyl group, a substituted oxy group (e.g., methoxy, ethoxy, propoxy group, and other $C_1$–$C_4$ alkoxy groups) and others. As the hydroxyalkyl group which may be protected by a protecting group, there may be mentioned a group combined with the said hydroxyl group which may be protected by a protecting group through an alkylene group having 1 to 6 carbon atoms and others. As the carboxyl group which may be protected by a protecting group, there may be mentioned a —COOR$^b$ group and others. The said R$^b$ is a hydrogen atom or an alkyl group, and the alkyl group includes, for example, methyl, ethyl, propyl, isopropyl, butyl, isobutyl, s-butyl, t-butyl, hexyl group, and other linear or branched-chain alkyl groups having 1 to 6 carbon atoms.

In the Formulae (IIIa) through (IIIC), an alicyclic hydrocarbon ring having 6 to 20 carbon atoms in the ring Z may be monocyclic or polycyclic rings such as condensed rings and bridged rings. As typical alicyclic hydrocarbon rings, there may be mentioned, for example, cyclohexane ring, cyclooctane ring, cyclodecane, adamantane ring, norbornane ring, norbornene ring, bornane ring, isobornane ring, perhydroindene ring, decalin ring, perhydrofluorene ring (tricyclo[7.4.0.0$^{3,8}$]tridecane ring), perhydroanthracene ring, tricyclo[5.2.1.0$^{2,6}$]decane ring, tricyclo[4.2.2.1$^{2,5}$]undecane ring, tetracyclo[4.4.0.1$^{2,5}$.1$^{7,10}$]dodecane ring and so on. The alicyclic hydrocarbon ring may have a substitute. The substituents include methyl group and other alkyl groups (e.g., a $C_1$–$C_4$ alkyl group and so on), chlorine atom and other halogen atoms, hydroxyl groups which may be protected by a protecting group, oxo group, carboxyl groups which may be protected by a protecting group.

As alkyl groups having 1 to 6 carbon atoms represented by $R^{27}$ through $R^{29}$ in the Formulae (IIIa) and (IIIb), there may be mentioned, for example, linear or branched-chain alkyl groups each having 1 to 6 carbon atoms, such as methyl, ethyl, propyl, isopropyl, butyl, isobutyl, s-butyl, t-butyl and hexyl groups. As alkyl groups represented by $R^{30}$ in the Formula (IIIc), there may be mentioned, for example, a linear or branched-chain alkyl group each having about 1 to about 20 carbon atoms such as methyl, ethyl, propyl, isopropyl, butyl, isobutyl, s-butyl, t-butyl, hexyl, octyl, decyl and dodecyl group. Hydroxyl groups which may be protected by a protecting group, hydroxyalkyl groups which may be protected by a protecting group, carboxyl groups which may be protected by a protecting group and —COOR$^a$ groups presented by $R^{30}$ have the same as described above.

The polymeric compound for photoresist of the present invention preferably has a solubility parameter (hereinafter, which may be called as "SP Value") as determined by the Fedors Method [Polym. Eng. Sci., 14, 147 (1974)] in a range from 9.5 $(cal/cm^3)^{1/2}$ to 12 $(cal/cm^3)^{1/2}$ [=from 19.4 $MPa^{1/2}$ to 24.5 $MPa^{1/2}$].

When a resist film is formed by applying a photoresist resin composition containing a polymeric compound having such solubility parameter in the above-specified range to a semiconductor substrate (a silicon wafer), the resulting resist film can satisfactorily adhere (be bonded) to the substrate and can be patterned with high resolution by alkaline development. If SP Value is lower than 9.5 $(cal/cm^3)^{1/2}$ [=19.4 $MPa^{1/2}$], the resist film may exhibit decreased adhesion to the substrate, the patterned resist may be peeled off from the substrate during development and does not remain thereon. In addition, if SP Value is more than 12 $(cal/cm^3)^{1/2}$[=24.5$MPa^{1/2}$], the resin composition may be repelled by the substrate and cannot be significantly applied thereto. Further, the resin composition may have excessively high affinity for alkaline developing solutions and may exhibit deteriorated contrast between exposed portions and non-exposed portions to decrease resolution. The solubility parameter of a polymeric compound can be regulated by appropriately selecting monomers constituting the polymer (a solubility parameter of the monomer) and the compositional proportions.

Polymeric compound of the present invention has a weight average molecular weight (Mw) of, for example, from about 1,000 to about 500,000, and preferably from about 3,000 to about 50,000, and a molecular distribution (Mw/Mn) of, for example, from about 1.5 to about 3.5, wherein Mn is a number average molecular weight, and both Mn and Mw are in terms of polystyrene.

A polymeric compound for photoresist of the present invention can be produced by co-polymerizing a mixture of monomers corresponding to monomer units. Each of the monomer units represented by the Formulae (I), (IIa) through (IIg) and (IIIa) through (IIIc) can be prepared by polymerizing a corresponding (meth)acrylic acid ester as a co-monomer.

[Monomer unit of Formula (I)]

Monomers corresponding to the monomer units of Formula (I) are represented by the following Formula (1). When these monomers include stereoisomer, each of these stereoisomers can be used alone or in combination.

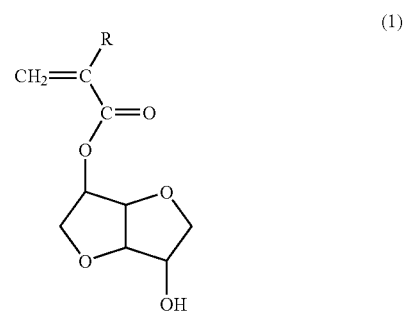

(1)

wherein R is a hydrogen atom or a methyl group.

Typical examples of the compounds represented by Formula(1) are the following compounds:

[1-1] 1,4:3,6-dianhydro-D-glycidol 2-(meth)acrylate (R=H or $CH_3$)

[1-2] 1,4:3,6-dianhydro-D-glycidol 5-(meth)acrylate (R=H or $CH_3$) [isosorbide (meth)acrylate is a mixture of the said [1-1] and [1-2]]

[1-3] 1,4:3,6-dianhydro-L-glycidol 2-(meth)acrylate (R=H or $CH_3$)

[1-4] 1,4:3,6-dianhydro-L-glycidol 5-(meth)acrylate (R=H or $CH_3$)

[1-5] 1,4:3,6-dianhydro-D-mannitol (meth)acrylate (=isomannide (meth)acrylate) (R=H or $CH_3$)

[1-6] 1,4:3,6-dianhydro-L-mannitol (meth)acrylate (R=H or $CH_3$)

[1-7] 1,4:3,6-dianhydro-D-inditol (meth)acrylate (R=H or $CH_3$)

[1-8] 1,4:3,6-dianhydro-L-inditol (meth)acrylate (R=H or $CH_3$)

A compound represented by Formula (1) can be obtained, for example, by reacting a corresponding 1,4:3,6-dianhydrohexytol (1,4:3,6-dianhydro form of a sugar alcohol having 6 carbon atoms) (e.g., an isosorbide, an isomannide and so on) with a (meth)acrylic acid or a reactive derivative according to a conventional esterification method using an acid catalyst or a catalyst for transesterification.

[Monomer units of Formulae (IIa) through (IIe)]

Monomers corresponding to the monomer units of Formulae (IIa) through (IIe) are presented by following Formulae (2a) through (2e), respectively. When these monomers include stereoisomers, each of the stereoisomers can be used alone or in combination.

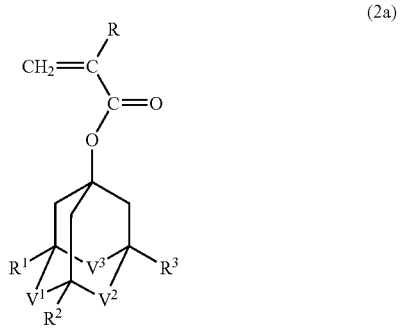

(2a)

-continued

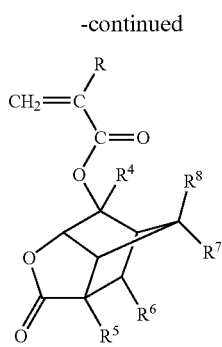
(2b)

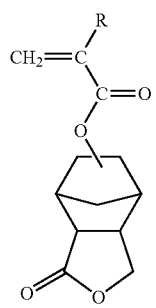
(2c)

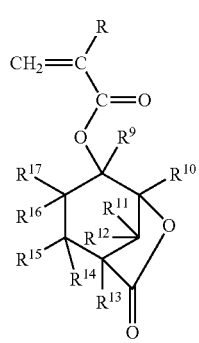
(2d)

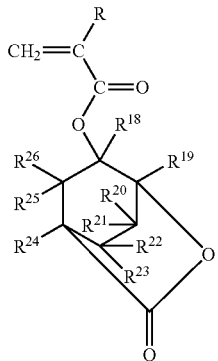
(2e)

wherein R is a hydrogen atom or a methyl group. $R^1$, $R^2$ and $R^3$ are identical to or different from and are each a hydrogen atom, an alkyl group, a hydroxyl group which may be protected by a protecting group, a hydroxyalkyl group which may be protected by a protecting group or a carboxyl group which may be protected by a protecting group. $V^1$, $V^2$ and $V^3$ are identical to or different from and are each —$CH_2$—, —CO— or —COO—. Specifically, at least one of $V^1$, $V^2$ and $V^3$ is —COO—. $R^4$, $R^5$, $R^6$, $R^7$ and $R^8$ are identical to or different from and are each a hydrogen atom, an alkyl group, a hydroxyl group which may be protected by a protecting group, a hydroxyalkyl group which may be protected by a protecting group or a carboxyl group which may be protected by a protecting group. $R^9$, $R^{10}$, $R^{11}$, $R^{12}$, $R^{13}$, $R^{14}$, $R^{15}$, $R^{16}$ and $R^{17}$ are identical to or different from and are each a hydrogen atom, an alkyl group, a hydroxyl group which may be protected by a protecting group, a hydroxyalkyl group which may be protected by a protecting group or a carboxyl group which may be protected by a protecting group. $R^{18}$, $R^{19}$, $R^{20}$, $R^{21}$, $R^{22}$, $R^{23}$, $R^{24}$, $R^{25}$, $R^{26}$ are identical to or different from and are each a hydrogen atom, an alkyl group, a hydroxyl group which may be protected by a protecting group, a hydroxyalkyl group which may be protected by a protecting group or a carboxyl group which may be protected by a protecting group.

Typical examples of the compounds represented by the Formula (2a) are, but are not limited to, the following compounds:

[2-1] 1-(meth)acryloyloxy-4-oxoadamantane (R=H or $CH_3$, $R^1=R^2=R^3$=H, $V^1$=—CO—, $V^2=V^3$=—$CH_2$—)

[2-2] 1-(meth)acryloyloxy-4-oxatricyclo[4.3.1.1$^{3,8}$]undecane-5-one (R=H or $CH_3$, $R^1=R^2=R^3$=H, $V^2$=—CO—O— where the left side of the group faces a carbon atom with which $R^2$ is combined, $V^1=V^3$=—$CH_2$—)

[2-3] 1-(meth)acryloyloxy-4,7-dioxatricyclo[4.3.1.1$^{3,9}$]dodecane-5,8-dion (R=H or $CH_3$, $R^1=R^2=R^3$=H, $V^1$=—CO—O— where the left side of the group faces a carbon atom with which $R^1$ is combined, $V^2$=—CO—O—where the left side of the group faces a carbon atom with which $R^2$ is combined, $V^3$=—$CH_2$—)

[2-4] 1-(meth)acryloyloxy-4,8-dioxatricyclo[4.3.1.1$^{3,9}$]dodecane-5,7-dion (R=H or $CH_3$, $R^1=R^2=R^3$=H, $V^1$=—O—CO— where the left side of the group faces a carbon atom with which $R^1$ is combined, $V^2$=—CO—O—where the left side of the group faces a carbon atom with which $R^2$ is combined, $V^3$=—$CH_2$—)

[2-5] 1-(meth)acryloyloxy-5,7-dioxatricyclo[4.3.1.1$^{3,9}$]dodecane-4,8-dion (R=H or $CH_3$, $R^1=R^2=R^3$=H, $V^1$=—CO—O—where the left side of the group faces a carbon atom with which $R^1$ is combined, $V^2$=—O—CO—where the left side of the group faces a carbon atom with which $R^2$ is combined, $V^3$=—$CH_2$—)

Compounds represented by Formula (2a) can be obtained, for example, by reacting a corresponding cyclic alcohol derivative with a (meth)acrylic acid or a reactive derivative thereof according to a conventional esterification method using an acid catalyst or a catalyst for transesterification.

Typical examples of the compounds represented by the Formula (2b) are, but are not limited to, the following compounds:

[2-6] 5-(meth)acryloyloxy-3-oxatricyclo[4.2.1.0$^{4,8}$]nonane-2-one (=5-(meth)acryloyloxy-2,6-norbornanecarbolactone) (R=H or $CH_3$, $R^4=R^5=R^6=R^7=R^8$=H)

[2-7] 5-(meth)acryloyloxy-5-methyl-3-oxatricyclo[4.2.1.0$^{4,8}$] nonane-2-one (R=H or $CH_3$, $R^4$=$CH_3$, $R^5=R^6=R^7=R^8$=H)

[2-8] 5-(meth)acryloyloxy-1-methyl-3-oxatricyclo[4.2.1.0$^{4,8}$] nonane-2-one (R=H or $CH_3$, $R^5$=$CH_3$, $R^4=R^6=R^7=R$=H)

[2-9] 5-(meth)acryloyloxy-9-methyl-3-oxatricyclo[4.2.1.0$^{4,8}$] nonane-2-one (R=H or $CH_3$, $R^6$=$CH_3$, $R^4=R^5=R^7=R^8$=H)

[2-10] 5-(meth)acryloyloxy-9-carboxy-3-oxatricyclo [4.2.1.0$^{4,8}$] nonane-2-one (R=H or $CH_3$, $R^4=R^5=R^7=R^8$=H, $R^6$=COOH)

[2-11] 5-(meth)acryloyloxy-9-methoxycarboxy-3-oxatricyclo [4.2.1.0$^{4,8}$]nonane-2-one (R=H or $CH_3$, $R^4=R^5=R^7=R^8$=H, $R^6$=methoxycarbonyl group)

[2-12] 5-(meth)acryloyloxy-9-ethoxycarboxy-3-oxatricyclo [4.2.1.0$^{4,8}$]nonane-2-one (R=H or CH$_3$, R$^4$=R$^5$=R$^7$=R$^8$=H, R$^6$= ethoxycarbonyl group)

[2-13] 5-(meth)acryloyloxy-9-t-butoxycarboxy-3-oxatricyclo [4.2.1.0$^{4,8}$]nonane-2-one (R=H or CH$_3$, R$^4$=R$^5$=R$^7$=R$^8$=H, R$^6$=t-butoxycarbonyl group)

Compounds represented by Formula (2b) can be obtained, for example, by reacting a corresponding cyclic alcohol derivative with a (meth)acrylic acid or a reactive derivative according to a conventional esterification method using an acid catalyst or a catalyst for transesterification. Then, cyclic alcohol derivatives used as a raw material in the process can be obtained, for example, by subjecting a corresponding 5-norbornene-2-carboxylic acid derivative or an ester thereof, a peracid including acetic peracid and m-chlorobenzoic peracid or a peroxide including hydroperoxide, hydroperoxide with tungsten oxide, and a metallic compound such as tungstic acid to reaction such as epoxidation or ring forming reaction.

Typical examples of the compounds represented by the Formula (2c) are, but are not limited to, the following compounds:

[2-14] 8-(meth)acryloyloxy-4-oxatricyclo[5.2.1.0$^{2,6}$]decan-5-one (R=H or CH$_3$)

[2-15] 9-(meth)acryloyloxy-4-oxatricyclo[5.2.1.0$^{2,6}$] decan-5-one (R=H or CH$_3$)

Compound represented by Formula (2c) can be obtained, for example, by reacting a corresponding cyclic alcohol derivative with a (meth)acrylic acid or a reactive derivative according to a conventional esterification method using an acid catalyst or a catalyst for transesterification.

Typical examples of the compounds represented by the Formula (2d) are, but are not limited to, the following compounds:

[2-16] 4-(meth)acryloyloxy-6-oxabicyclo[3.2.1]octane-7-one (R=H or CH$_3$, R$^9$=R$^{10}$=R$^{11}$=R$^{12}$=R$^{13}$=R$^{14}$=R$^{15}$=R$^{16}$=R$^{17}$=H)

[2-17] 4-(meth)acryloyloxy-4-methyl-6-oxabicyclo[3.2.1]octane-7-one (R=H or CH$_3$, R$^{10}$=R$^{11}$=R$^{12}$=R$^{13}$=R$^{14}$=R$^{15}$=R$^{16}$=R$^{17}$=H, R$^9$=CH$_3$)

[2-18] 4-(meth)acryloyloxy-5-methyl-6-oxabicyclo[3.2.1]octane-7-one (R=H or CH$_3$, R$^9$=R$^{11}$=R$^{12}$=R$^{13}$=R$^{14}$=R$^{15}$=R$^{16}$=R$^{17}$=H, R$^{10}$=CH$_3$)

[2-19] 4-(meth)acryloyloxy-4,5-dimethyl-6-oxabicyclo [3.2.1]octane-7-one (R=H or CH$_3$, R$^{11}$=R$^{12}$=R$^{13}$=R$^{14}$=R$^{15}$=R$^{16}$=R$^{17}$=H, R$^9$=R$^{10}$=CH$_3$)

Typical examples of the compounds represented by the Formula (2e) are, but are not limited to, the following compounds:

[2-20] 6-(meth)acryloyloxy-2-oxabicyclo[2.2.2]octane-3-one (R=H or CH$_3$, R$^{18}$=R$^{19}$=R$^{20}$=R$^{21}$=R$^{22}$=R$^{23}$=R$^{24}$=R$^{25}$=R$^{26}$=H)

[2-21] 6-(meth)acryloyloxy-6-methyl-2-oxabicyclo[2.2.2]octane-3-one (R=H or CH$_3$, R$^{18}$=R$^{20}$=R$^{21}$=R$^{22}$=R$^{23}$=R$^{24}$=R$^{25}$=R$^{26}$=H, R$^{19}$=CH$_3$)

[2-22] 6-(meth)acryloyloxy-1-methyl-2-oxabicyclo[2.2.2]octane-3-one (R=H or CH$_3$, R$^{19}$=R$^{20}$=R$^{21}$=R$^{22}$=R$^{23}$=R$^{24}$=R$^{25}$=R$^{26}$=H, R$^{18}$=CH$_3$)

[2-23] 6-(meth)acryloyloxy-1,6-dimethyl-2-oxabicyclo [2.2.2]octane-3-one (R=H or CH$_3$, R$^{20}$=R$^{21}$=R$^{23}$=R$^{24}$=R$^{25}$=R$^{26}$=H, R$^{18}$R$^{19}$=CH$_3$)

Each of the compounds represented by Formulae (2d) and (2e) can be obtained, for example, by reacting a corresponding cyclic alcohol derivative with a (meth)acrylic acid or a reactive derivative according to a conventional esterification using an acid catalyst or a catalyst for transesterification.

[Monomer units represented by the Formulae (IIIa) through (IIIc)]

Monomers corresponding to monomer units represented by the said Formulae (IIIa) through (IIIc) are shown by the following Formulae (3a) through (3c). When these monomers include stereoisomers, each of the stereoisomers can be used alone or in combination as a mixture.

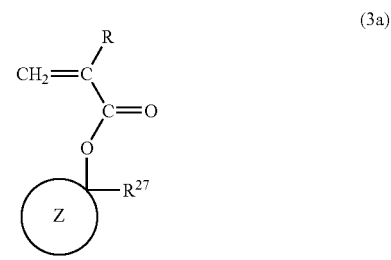

(3a)

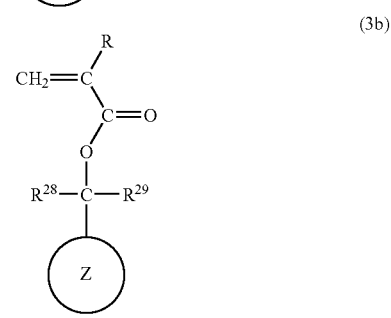

(3b)

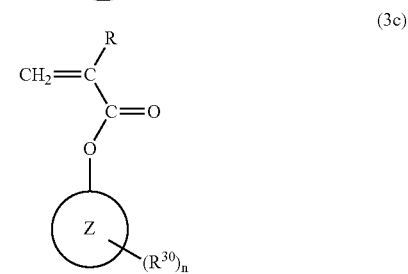

(3c)

wherein ring Z is an alicyclic hydrocarbon ring having 6 to 20 carbon atoms which may have a substitute. R is a hydrogen atom or a methyl group. R$^{27}$, R$^{28}$ and R$^{29}$ are identical to or different from and are each an alkyl group having 1 to 6 carbon atoms. R$^{30}$ is a substituent which is combined with ring Z and is identical to or different from an oxo group, an alkyl group, a hydroxyl group which may be protected by a protecting group, a hydroxyalkyl group which may be protected by a protecting group or a carboxyl group which may be protected by a protecting group where at least one of nR$^{30}$ s is a group of —COOR$^a$. The said R$^a$ is a tertiary hydrocarbon group which may have a substituent, a tetrahydrofuranyl group, a tetrahydropyranyl group or an oxepanyl group. n denotes an integer of 1 to 3.

Typical examples of the compounds represented by the Formula (3a) are, but are not limited to, the following compounds:

[3-1] 2-(meth)acryloyloxy-2-methyladamantane (R=H or CH$_3$, R$^{27}$=CH$_3$, Z=adamantane ring)

[3-2] 1-hydroxy-2-(meth)acryloyloxy-2-methyladamantane (R=H or $CH_3$, $R^{27}$=$CH_3$, Z=adamantane ring having a hydroxyl group at 1st position)

[3-3] 5-hydroxy-2-(meth)acryloyloxy-2-methyladamantane (R=H or $CH_3$, $R^{27}$=$CH_3$, Z=adamantane ring having a hydroxyl group at 5th position)

[3-4] 1,3-dihydroxy-2-(meth)acryloyloxy-2-methyladamantane (R=H or $CH_3$, $R^{27}$=$CH_3$, Z=adamantane ring having hydroxyl groups at 1st and 3rd positions)

[3-5] 1,5-dihydroxy-2-(meth)acryloyloxy-2-methyladamantane (R=H or $CH_3$, $R^{27}$=$CH_3$, Z=adamantane ring having hydroxyl groups at 1st and 5th positions)

[3-6] 1,3-dihydroxy-6-(meth)acryloyloxy-6-methyladamantane (R=H or $CH_3$, $R^{27}$=$CH_3$, Z=adamantane ring having hydroxyl groups at 1st and 3rd positions)

[3-7] 2-(meth)acryloyloxy-2-ethyladamantane (R=H or $CH_3$, $R^{27}$=$CH_2CH_3$, Z=adamantane ring)

[3-8] 1-hydroxy-2-(meth)acryloyloxy-2-ethyladamantane (R=H or $CH_3$, $R^{27}$=$CH_2CH_3$, Z=adamantane ring having a hydroxyl group at 1st position)

[3-9] 5-hydroxy-2-(meth)acryloyloxy-2-ethyladamantane (R=H or $CH_3$, $R^{27}$=$CH_2CH_3$, Z=adamantane ring having a hydroxyl group at 5th position)

[3-10] 1,3-dihydroxy-2-(meth)acryloyloxy-2-ethyladamantane (R=H or $CH_3$, $R^{27}$=$CH_2CH_3$, Z=adamantane ring having hydroxyl groups at 1st and 3rd positions)

[3-11] 1,5-dihydroxy-2-(meth)acryloyloxy-2-ethyladamantane (R=H or $CH_3$, $R^{27}$=$CH_2CH_3$, Z=adamantane ring having hydroxyl groups at 1st and 5th positions)

[3-12] 1,3-dihydroxy-6-(meth)acryloyloxy-6-ethyladamantane (R=H or $CH_3$, $R^{27}$=$CH_2CH_3$, Z=adamantane ring having hydroxyl groups at 1st and 3rd positions)

Compounds represented by Formula (3a) can be obtained, for example, by reacting a corresponding cyclic alcohol derivative with a (meth)acrylic acid or a reactive derivative according to a conventional esterification using an acid catalyst or a catalyst for transesterification.

Typical examples of the compounds represented by the Formula (3b) are, but are not limited to, the following compounds:

[3-13] 1-(1-(meth)acryloyloxy-1-methylethyl)adamantane (R=H or $CH_3$, $R^{28}$=$R^{29}$=$CH_3$, Z=adamantane ring)

[3-14] 1-hydrpxy-3-(1-(meth)acryloyloxy-1-methylethyl) adamantane (R=H or $CH_3$, $R^{28}$=$R^{29}$=$CH_2CH_3$, Z=adamantane ring having a hydroxyl group at 1st position)

[3-15] 1-(1-ethyl-1-(meth)acryloyloxypropyl)adamantane (R=H or $CH_3$, $R^{28}$=$R^{29}$=$CH_3$, Z=adamantane ring)

[3-16] 1-hydroxy-3-(1-ethyl-1-(meth)acryloyloxypropyl) adamantane (R=H or $CH_3$, $R^{28}$=$R^{29}$=$CH_2CH_3$, Z=adamantane ring having a hydroxyl group at 1st position)

[3-17] 1-(1-(meth)acryloyloxy-1-methylpropyl)adamantane (R=H or $CH_3$, $R^{28}$=$CH_3$, $R^{29}$=$CH_2CH_3$, Z=adamantane ring)

[3-18] 1-hydroxy-3-(1-(meth)acryloyloxy-1-methylpropyl) adamantane (R=H or $CH_3$, $R^{28}$=$CH_3$, $R^{29}$=$CH_2CH_3$, Z=adamantane ring having a hydroxyl group at 1st position)

[3-19] 1-(1-(meth)acryloyloxy-1,2-dimethylpropyl)adamantane (R=H or $CH_3$, $R^{28}$=$CH_3$, $R^{29}$=$CH(CH_3)_2$, Z=adamantane ring)

[3-20] 1-hydroxy-3-(1-(meth)acryloyloxy-1,2-dimethylpropyl) adamantane (R=H or $CH_3$, $R^{28}$=$CH_3$, $R^{29}$=$CH(CH_3)_2$, Z=adamantane ring having a hydroxyl group at 1st position)

[3-21] 1,3-dihydroxy-5-(1-(meth)acryloyloxy-1-methylethyl) adamantane (R=H or $CH_3$, $R^{28}$=$R^{29}$=$CH_3$, Z=adamantane ring having hydroxyl groups at 1st and 3rd positions)

[3-22] 1-(1-ethyl-1-(meth)acryloyloxypropyl)-3,5-dihydroxy adamantane (R=H or $CH_3$, $R^{28}$=$R^{29}$=$CH_2CH_3$, Z=adamantane ring having hydroxyl groups at 3rd and 5th positions)

[3-23] 1,3-dihydroxy-5-(1-(meth)acryloyloxy-1-methylpropyl) adamantane (R=H or $CH_3$, $R^{28}$=$CH_3$, $R^{29}$=$CH_2CH_3$, Z=adamantane ring having hydroxyl groups at 1st and 3rd positions)

[3-24] 1,3-dihydroxy-5-(1-(meth)acryloyloxy-1,2-dimethylpropyl) adamantane (R=H or $CH_3$, $R^{28}$=$CH_3$, $R^{29}$=$CH (CH_3)_2$, Z=adamantane ring having hydroxyl groups at 1st and 3rd positions)

Compounds represented by Formula (3b) can be obtained, for example, by reacting a corresponding methanol derivative having an alicyclic group at 1-position with a (meth) acrylic acid or a reactive derivative according to a conventional esterification using an acid catalyst or a catalyst for transesterification.

Typical examples of the compounds represented by the Formula (3c) are, but are not limited to, the following compounds:

[3-25] 1-t-butoxycarbonyl-3-(meth)acryloyloxy adamantane (R=H or $CH_3$, $R^{30}$=t-butoxycarbonyl group, n=1, Z=adamantane ring)

[3-26] 1,3-bis(t-butoxycarbonyl)-5-(meth)acryloyloxy adamantane (R=H or $CH_3$, $R^{30}$=t-butoxycarbonyl group, n=2, Z=adamantane ring)

[3-27] 1-t-butoxycarbonyl-3-hydroxy-5-(meth)acryloyloxy adamantane (R=H or $CH_3$, $R^{30}$=OH, t-butoxycarbonyl group, n=2, Z=adamantane ring)

[3-28] 1-(2-tetrahydropyranyloxycarbonyl)-3-(meth)acryloyloxy adamantane (R=H or $CH_3$, $R^{30}$=2-tetrahydropyranyloxycarbonyl group, n=1, Z=adamantane ring)

[3-29] 1,3-bis(2-tetrahydropyranyloxycarbonyl)-5-(meth) acryloyloxy adamantane (R=H or $CH_3$, $R^{30}$=2-tetrahydropyranyloxycarbonyl group, n=2, Z=adamantane ring)

[3-30] 1-hydroxy-3-(2-tetrahydropyranyloxycarbonyl)-5-(meth)acryloyloxy adamantane (R=H or $CH_3$, $R^{30}$=OH, 2-tetrahydropyranyloxycarbonyl group, n=2, Z=adamantane ring)

Compounds represented by Formula (3c) can be obtained, for example, by reacting a corresponding cyclic alcohol derivative with a (meth)acrylic acid or a reactive derivative thereof according to a conventional esterification method using an acid catalyst or a catalyst for transesterification.

To obtain polymeric compound for photoresist of the present invention, polymerization of monomer mixture can be performed according to an ordinary procedure used in production of acrylic polymers, such as solution polymerization, bulk polymerization, suspension polymerization, bulk-suspension polymerization and emulsion polymerization, particularly, solution polymerization is suitable. In addition, dropping polymerization is preferred in solution polymerizations. Specifically, dropping polymerization is, for example, performed by (i) a process comprising the steps of preparing a monomer solution by dissolving monomers in an organic solvent and a polymerization initiator solution by dissolving in an organic solvent in advance, respectively, and dropping the monomer solution and the polymerization initiator solution into an organic solvent kept at a constant temperature, respectively, (ii) a process comprising the step of dissolving monomers and a polymerization initiator in an organic solvent, and dropping the obtained mixed solution into an organic solvent kept at a constant temperature, (iii) a process comprising the step of preparing by dissolving monomers in an organic solvent and a polymerization initiator solution by dissolving in an organic solvent in advance, respectively, and dropping the polymerization initiator solution into the monomer solution kept at a constant temperature.

As a polymerization solvent, a known solvent can be used and there may be mentioned, for example, ethers (chain ethers such as diethyl ether and glycol ethers including propyleneglycol monomethylether, cyclic ethers such as tetrahydrofuran and dioxane, and others), esters (methyl acetate, ethyl acetate, butyl acetate, ethyl lactate, glycol ether esters including propyleneglycol monomethylether acetate, and others), ketones (acetone, methylethylketone, methylisobutylketone, cyclohexanone and others), amides (N,N-dimethylacetoamide, N,N-dimethylformamide and others), sulfoxides (dimethylsulfoxide and others), alcohols (methanol, ethanol, propanol and others), hydrocarbons (aromatic hydrocarbons such as benzene, toluene and xylene, aliphatic hydrocarbons such as hexane, alicyclic hydrocarbons such as cyclohexane, and others) and mixed solvents thereof. Further, as a polymerization initiator, a known polymerization initiator can be used. A polymerization temperature can appropriately be selected, for example, in a range from about 30 to about 150° C.

The polymer obtained by polymerization can be purified by precipitation or reprecipitation. A solvent for precipitation or reprecipitation may be either an organic solvent or water, and further may be a mixed solvent. As an organic solvent used for precipitation or re-precipitation, there may be mentioned, for example, hydrocarbons (aliphatic hydrocarbons such as pentane, hexane, heptane and octane; alicyclic hydrocarbons such as cyclohexane and methylcyclohexane; aromatic hydrocarbons such as benzene, toluene and xylene), halogenated hydrocarbons (halogenated aliphatic hydrocarbons such as methylenechloride, chloroform and carbontetrachloride; halogenated aromatic carbons such as chlorobenzene and dichlorobenzene and others), nitro compounds such as nitromethane and nitroethane, nitriles such as acetonitrile and benzonitrile, ethers (chain ethers such as diethylether, diisopropylether and dimethoxyethane; cyclic ethers such as tetrahydrofuran and dioxane), ketones such as acetone, methylethylketone and diisobutylketone, esters such as ethyl acetate and butyl acetate, carbonates such as dimethyl carbonate, diethyl carbonate, ethylene carbonate and propylene carbonate, alcohols such as methanol, ethanol, propanol, isopropylalcohol and butanol, carboxylic acids such as acetic acid, and mixed solvents containing these solvents.

Among them, solvents containing at least hydrocarbons, particularly aliphatic hydrocarbons such as hexane, are preferred, when used as a precipitation or pre-precipitation solvent. As to such solvents containing at least hydrocarbons, the ratio of hydrocarbons (e.g., aliphatic hydrocarbons such as hexane) to another solvents is, for example, the former/the latter (ratio by volume; 25° C.)=from about 10/90 to about 99/1, preferably the former/the latter (ratio by volume; 25° C.)=from about 30/70 to about 98/2, more preferably the former/the latter (ratio by volume; 25° C.)=from about 50/50 to about 97/3.

The resin composition for photoresist of the present invention comprises the said polymeric compound for photoresist of the present invention and a photosensitive acid generator.

Such photosensitive acid generator include conventional or known, compounds that efficiently generate an acid upon irradiation with light. Such compounds include, for example, diazonium salts, iodonium salts (e.g., diphenyliodonium hexafluorophosphate), sulfonium salts (e.g., triphenylsulfonium hexafluoroantimonate, triphenylsulfonium hexafluorophosphate, and triphenylsulfonium methanesulfonate), sulfonic acid esters [e.g., 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane], oxathiazol derivatives, s-triazine derivatives, disulfone derivatives (e.g., diphenyldisulfone), imide compounds, oxime sulfonates, diazonaphthoquinone, and benzoin tosylate. Each of these photosensitive acid generators can be used alone or in combination.

The amount of the photosensitive acid generator can appropriately be selected depending on the strength of the acid generated by light irradiation, the proportions of the individual monomer units (a repeating unit) in the polymeric compounds and other factors and is, for example, from about 0.1 to about 30 parts by weight, preferably from about 1 to about 25 parts by weight, and more preferably from about 2 to about 20 parts by weight, relative to 100 parts by weight of the polymeric compound.

The photoresist resin composition may comprise alkali-soluble resins (e.g., novolak resins, phenol resins, imide resins, carboxyl-group-containing resins), and other alkali-soluble components, coloring agents (e.g., dyestuffs), and organic solvents (e.g., hydrocarbons, halogenated hydrocarbons, alcohols, esters, amides, ketones, ethers, Cellosolves, Carbitols, glycoletheresters, and mixtures of these solvents.

The photoresist resin composition is applied to a base or a substrate, is dried, and the resulting film (resist film) is exposed to light through a predetermined mask (or is further subjected to post-exposure baking) to form a latent image pattern, and the film is then developed to yield a fine pattern with a high degree of precision.

As a base or substrate, there may be mentioned silicon wafers, metals, plastics, glass, and ceramics. The photoresist resin composition can be applied using a conventional application means such as a spin-coater, a dip-coater, and a roller-coater. The applied film has a thickness of, for example, from about 0.1 to about 20 μm, preferably from about 0.3 to about 2 μm.

In exposure, light rays with different wavelengths such as ultraviolet rays and X-ray can be used. For example, g-line, i-line, excima-laser (e.g., XeCl, KrF, KrCl, ArF, or ArCl excimer laser) are usually used for semiconductor resist. An exposure energy is, for example, from about 1 to about 1000 mJ/cm$^2$, and preferably from about 10 to about 500 mJ/cm$^2$ By exposure, an acid is generated from the photosensitive acid generator, and the acid allows, for example, the protecting group (leaving group) of a carboxyl group of a monomer unit having an acid-eliminating group (an alkali-soluble unit) of the polymeric compound to leave promptly and thereby yields a carboxyl group that contributes to solubilization. Therefore, by developing by water or an alkali-developer, a predetermined pattern can be formed with a high degree of precision.

EXAMPLES

The present invention will now be described in more detail with reference to examples below and the present invention is not limited at all according to the examples. In addition, a compound indicated by "acrylate" subsequent to a compound number (a monomer-number) means a compound having an acryloyloxy group of two compounds corresponding to the compound number described in the description, and a compound indicated by "methacrylate" subsequent to a compound number means indicates a compound having an methacryloyloxy group of the two compounds corresponding to the compound number. A number at the lower right of parentheses in the formulae indicates % by mole of a charged monomer corresponding to the monomer unit (repeating unit). A weight average molecular weight (Mw) and a molecular weight distribution (Mw/Mn) are calculated in terms of a standard polystyrene by a GPC measurement using a refractometer (RI) as a detector and using tetrahydrofuran (THF) as an eluent. The GPC measurement is performed with the column connecting three columns "KF-806L" (trade name) manufactured by SHOUWA DENKOH Inc. in series under conditions of 40° C. of column temperature, 40° C. of RI temperature and 0.8 ml/min of flow rate of eluent.

Example 1

Synthesis of Resin Having the Following Structure

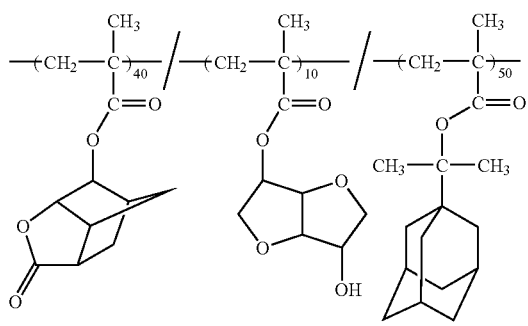

In a round-bottom flask equipped with a reflux condenser, a stirring bar and a three-way stopcock, 20 g of propyleneglycol monomethylether acetate (PGMEA) was placed in a nitrogen atmosphere, while maintaining the temperature at 75° C. with stiring, and 18.41 g (82.9 mmole) of 5-methacryloyloxy-2,6-norbornanecarbolactone [compound number [2-6] (methacrylate)], 4.44 g (20.7mmole) of isosorbide methacrylate [a mixture of a compound number [1-1] (methacrylate) and a compound number [1-2] (methacrylate)], 27.16 g (103.6 mmole) of 1-(1-methacryloyloxy-1-methylethyl)adamantane [compound number [3-13] (methacrylate)], 6.0 g of dimethyl-2,2'-azobisisobutylate (initiator, "V-601" manufactured by WAKO JUNYAKU INDUSTRY) and 180 g of PGMEA were mixed and the obtained monomer solution was dropped at constant rate over 6 hours while stirring. After completion of dropping, the resulting mixture was stirred for more 2 hours. After the completion of the polymerization, the polymer was purified by following procedures. The resulting reaction solution is subjected to filtration through a filter of 0.1 μm pore diameter, and subsequently, the filtrate was dropped into a mixed solution of 3410 g of hexane and 280 g of ethyl acetate while stirring. The formed precipitation was separated by filtration. The recovered precipitation was dried under reduced pressure, was dissolved in 200 g of THF (tetrahydrofuran). The precipitating and purification procedure using the mixed solution of hexane and ethyl acetate as described above was repeated to yield 45.5 g of the desired resin. The recovered polymer was subjected to GPC analysis to find that the polymer has a weight-average molecular weight (Mw) of 9400 and a molecular weight distribution (Mw/Mn) of 2.37.

Example 2

Synthesis of Resin Having the Following Structure

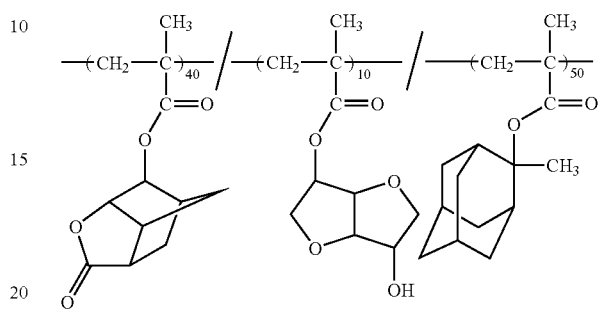

The procedure of Example 1 was repeated, except for using monomer components of 19.54 g (88.0 mmole) of 5-methacryloyloxy-2,6-norbornanecarbolactone [compound number [2-6] (methacrylate)], 4.71g (22.0mmole) of isosorbide methacrylate [mixture of a compound number [1-1] (methacrylate) and a compound number [1-2] (methacrylate)], 25.75 g (110.0 mmole) of 2-methacryloyloxy-2-methyladamantane [compound number [3-1] (methacrylate)], and then 44.7 g of the desired resin was obtained. The recovered polymer was subjected to GPC analysis to find that the polymer has a weight-average molecular weight (Mw) of 10100 and a molecular weight distribution (Mw/Mn) of 2.53.

Example 3

Synthesis of Resin Having the Following Structure

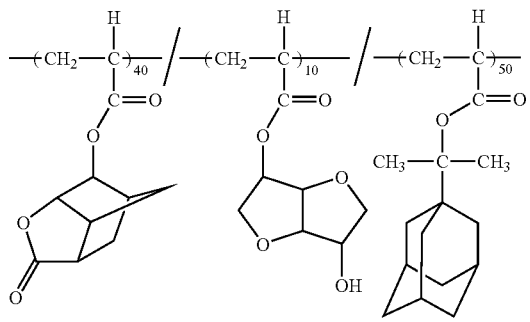

The procedure of Example 1 was repeated, except for using monomer components of 18.31 g (88.0 mmole) of 5-acryloyloxy-2,6-norbornanecarbolactone [compound number [2-6] (acrylate)], 4.40 g (22.0 mmole) of isosorbide acrylate [mixture of a compound number [1-1] (acrylate) and a compound number [1-2] (acrylate)], 27.29 g (110.0 mmole) of 1-(1-acryloyloxy-1-methylethyl)adamantane [compound number [3-13] (acrylate)] and then 43.8 g of the desired resin was obtained. The recovered polymer was subjected to GPC analysis to find that the polymer has a weight-average molecular weight (Mw) of 8700 and a molecular weight distribution (Mw/Mn) of 2.35.

Comparative Example 1

Synthesis of Resin Having the Following Structure

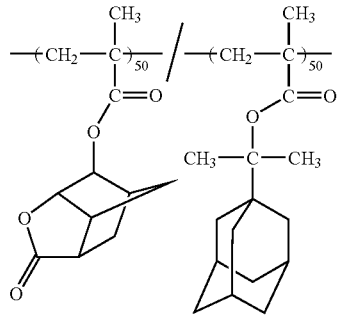

In a round-bottom flask equipped with a reflux condenser, a stirring bar and a three-way stopcock, 20 g of propyleneglycol monomethylether acetate (PGMEA) was placed in a nitrogen atmosphere, while maintaining the temperature at 75° C. with stiring, and 22.93 g (103.3 mmoles) of 5-methacryloyloxy-2,6-norbornanecarbolactone [compound number [2-6] (methacrylate)], 27.07 g (103.3 mmole) of 1-(1-methacryloyloxy-1-methylethyl)adamantane [compound number [3-13] (methacrylate)], 6.0 g of dimethyl-2,2'-azobisisobutylate (initiator, "V-601" manufactured by WAKO JUNYAKU INDUSTRY) and 180 g of PGMEA were mixed and the obtained monomer solution was dropped at constant rate over 6 hours while stirring. When dropping, the polymer solution becomes clouded to precipitate the polymer. Thus, the polymer, which is soluble in PGMEA cannot be obtained.

Comparative Example 2

Synthesis of Resin Having the Following Structure

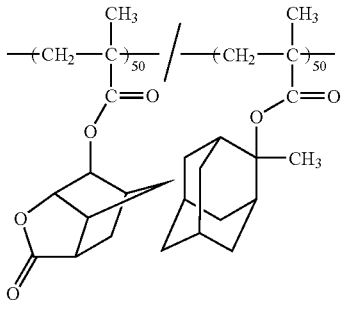

The procedure of Comparative Example 1 was repeated, except for using monomer components of 24.34 g (109.6 mmole) of 5-methacryloyloxy-2,6-norbornanecarbolactone [compound number [2-6] (methacrylate)] and 25.66 g (109.6 mmole) of 2-methacryloyloxy-2-methyladamantane [compound number [3-1] (methacrylate)] and 180 g of PGMEA were mixed and the obtained monomer solution was dropped at constant rate over 6 hours while stirring. When dropping, the polymer solution becomes clouded to precipitate the polymer. Thus, the polymer, which is soluble in PGMEA cannot be obtained.

Comparative Example 3

Synthesis of Resin Having the Following Structure

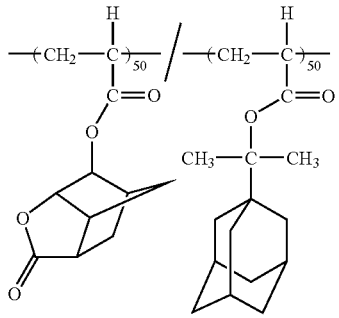

The procedure of Comparative Example 1 was repeated, except for using monomer components of 22.81 g (109.6 mmole) of 5-methacryloyloxy-2,6-norbornanecarbolactone [compound number [2-6] (acrylate)] and 27.19 g (109.6 mmole) of 1-(1-acryloyloxy-1-methylethyl)adamantane [compound number [3-13] (acrylate)] and 180 g of PGMEA were mixed and the obtained monomer solution was dropped at constant rate over 6 hours while stirring. When dropping, the polymer solution becomes clouded to precipitate the polymer. Thus, the polymer, which is soluble in PGMEA cannot be obtained.

Evaluation Test

A total of 100 parts by weight of each of the polymers obtained in the above Examples, 10 parts by weight of triphenylsulfoniumhexafluoroantimonate, and a PGMEA were mixed to thereby prepare a photoresist resin composition having a polymer concentration of 17% by weight. This photoresist resin composition was applied onto a silicon wafer by spin coating to form a photosensitive layer 1.0 μm thick. The photosensitive layer was subjected to prebaking on a hot plate at a temperature of 100° C. for 150 seconds, and was exposed to light through a mask using KrF excimer laser 247 nm in wavelength at an irradiance of 30 mJ/cm$^2$. The exposed layer was then subjected to postexposure baking at a temperature of 100° C. for 60 seconds; was subjected to development in a 0.3 M aqueous tetramethylammonium hydroxide solution for 60 seconds; and was rinsed with pure water to yield a pattern with a 0.20 μm line and space in any case.

Production Example 1

[Production of Isosorbide Methacrylate and Isosorbide acrylate]

While a mixture of 146 g of isosorbide (manufactured by TOKYO KASEI INDUSTRY Inc.), 100 g of pyridine and 1.5 L of tetrahydrofuran was stirred at room temperature in a nitrogen atmosphere, 83 g of methacrylchloride was dropped thereto over one hour. After stirred for 3 hours at room temperature, 300 g of water was added to the reaction mixture and the organic layer was concentrated under reduced pressure. By subjecting the concentrate was subjected to column chromatography on a silica gel to thereby yield 24 g of 1,4:3,6-dianhydro-D-glycidole 2-methcrylate represented by the following Formula (A) and 11 g of 1,4:3,6-dianhydro-D-glycidole 5-methcrylate represented by the following Formula (B). In the Example 1 and 2, a mixture of them was used as a raw material of monomer.

Further, by using acrylchloride instead of methacrylchloride, isosorbide acrylate was produced by the same procedure as described above and the product was used as a raw material of monomer of Example 3.

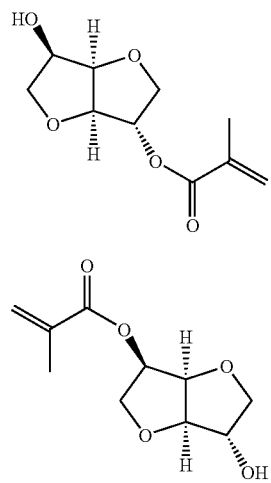

[Spectral Data of 1,4:3,6-dianhydro-D-glycidole 2-methcrylate (A)]

$^1$H-NMR (CDCl$_3$) δ; 1.95 (s, 3H), 2.69 (brs, 1H), 3.58 (dd, 1H), 3.91 (dd, 1H), 4.07 (s, 2H), 4.32 (brs, 1H), 4.53 (d, 1H), 4.65 (t, 1H), 5.28 (s, 1H), 5.62 (t, 1H), 6.12 (s, 1H)

$^{13}$C-NMR (CDCl$_3$) δ; 18.1, 72.3, 73.5, 73.6, 78.7, 82.1, 85.7, 126.5, 135.6, 166.3

MS m/e 215 (M+H)

[Spectral Data of 1,4:3, 6-dianhydro-D-glycidole 5-methcrylate (B)]

$^1$H-NMR (CDCl$_3$) δ; 1.96 (s, 3H), 2.67 (brs, 1H), 3.08-3.93 (m, 4H), 4.32 (d, 1H), 4.40 (d, 1H), 4.89 (t, 1H), 5.20 (q, 1H), 5.62 (s, 1H), 6.15 (s, 1H).

$^{13}$C-NMR (CDCl$_3$) δ; 18.2, 70.8, 74.3, 75.3, 75.5, 81.0, 88.5, 126.3, 135.7, 166.9

MS m/e 215 (M+H)

[Spectral Data of isosorbide acrylate]

MS m/e 201 (M+H)

INDUSTRIAL APPLICABILITY

When a photoresist resin composition containing a polymeric compound for photoresist of the present invention is used for production of a semiconductor, a fine pattern can be accurately formed.

The invention claimed is:

1. A resin composition for photoresist, comprising a polymeric compound and a photosensitive acid generator, wherein the polymeric compound comprises a monomer unit having a 2,6-dioxabicyclo[3.3.0]octane skeleton in the structure.

2. The resin composition for photoresist according to claim 1, wherein the monomer unit having a 2,6-dioxabicyclo[3.3.0]octane skeleton is a monomer unit represented by the following Formula (I):

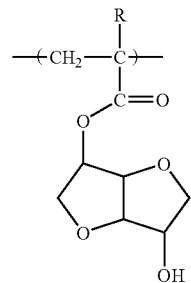

wherein R is a hydrogen atom or a methyl group.

3. The resin composition for photoresist according to claim 1, wherein the polymeric compound comprises a monomer unit having a 2,6-dioxabicyclo[3.3.0]octane skeleton, a monomer unit having a group of adhesion to substrate, and a monomer unit having an acid-eliminating group.

4. The resin composition for photoresist according to claim 1, wherein the polymeric compound comprises (A) a monomer unit having a 2,6-dioxabicyclo[3.3.0]octane skeleton, (B) a monomer unit corresponding to a (meth)acrylic acid ester wherein an alicyclic hydrocarbon group having 6 to 20 carbon atoms including a lactone ring is combined with an oxygen atom constituting the ester, and (C) a monomer unit corresponding to a (meth)acrylic acid ester having an alicyclic hydrocarbon group having 6 to 20 carbon atoms and a group which can leave by action of an acid.

5. The resin composition for photoresist according to claim 1, wherein the polymeric compound comprises (A) a monomer unit having a 2,6-dioxabicyclo[3.3.0]octane skeleton, (B1) at least one monomer unit selected from monomer units represented by the following Formulae (IIa) through (IIe):

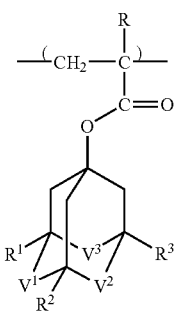

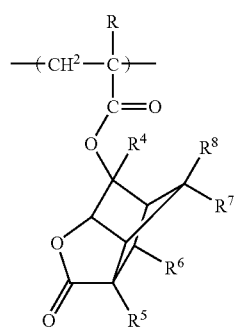

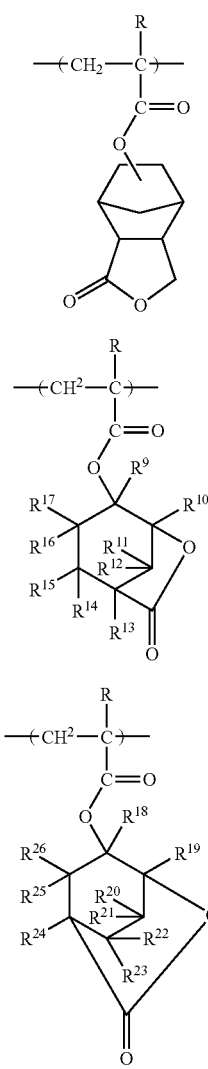

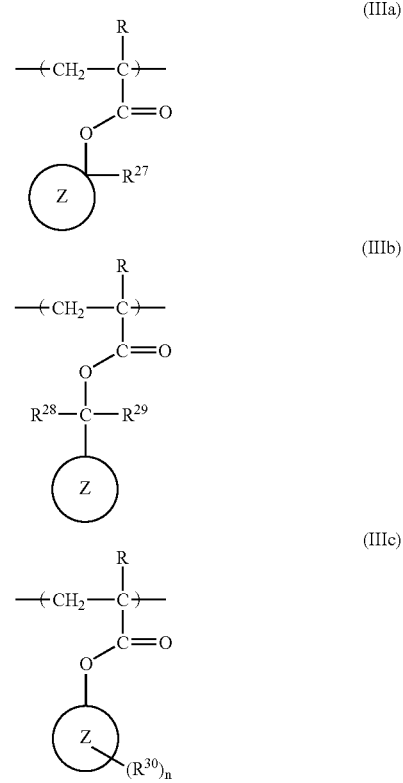

wherein R is a hydrogen atom or a methyl group; $R^1$, $R^2$ and $R^3$ are identical to or different from and are each a hydrogen atom, an alkyl group, a hydroxyl group which may be protected by a protecting group, a hydroxyalkyl group which may be protected by a protecting group or a carboxyl group which may be protected by a protecting group, and each of $V^1$, $V^2$ and $V^3$ are identical to or different from and are each —$CH_2$—, —CO— or —COO—, where at least one of $V^1$, $V^2$ and $V^3$ is —COO—; $R^4$, $R^5$, $R^6$, $R^7$ and $R^8$ are identical to or different from and are each a hydrogen atom, an alkyl group, a hydroxyl group which may be protected by a protecting group, a hydroxyalkyl group which may be protected by a protecting group or a carboxyl group which maybe protected by a protecting group; each of $R^9$, $R^{10}$, $R^{11}$, $R^{12}$, $R^{13}$, $R^{14}$, $R^{15}$, $R^{16}$ and $R^{17}$ are identical to or different from and are each a hydrogen atom, an alkyl group, a hydroxyl group which may be protected by a protecting group, a hydroxyalkyl group which may be protected by a protecting group or a carboxyl group which may be protected by a protecting group; each of $R^{18}$, $R^{19}$, $R^{20}$, $R^{21}$, $R^{22}$, $R^{23}$, $R^{24}$, $R^{25}$ and $R^{26}$ identical to or different from and are each a hydrogen atom, an alkyl group, a hydroxyl group which may be protected by a protecting group, a hydroxyalkyl group which may be protected by a protecting group or a carboxyl group which may be protected by a protecting group, and (C1) at least one monomer unit selected from among a monomer unit represented by the following Formulae (IIIa) through (IIIc):

wherein a ring Z is an alicyclic hydrocarbon ring of 6 to 20 carbon atoms; R is a hydrogen atom or a methyl group; each of $R^{27}$, $R^{28}$ and $R^{29}$ are identical to or different from and are each an alkyl group of 1 to 6 carbon atoms; $R^{30}$ which is a group bound to the ring Z is identical to or different from an oxo group, an alkyl group, a hydroxyl group which may be protected by a protecting group, a hydroxyalkyl group which may be protected by a protecting group or a carboxyl group which may be protected by a protecting group where least one of $nR^{30}$s is a group of —$COOR^a$, wherein the $R^a$ is a tertiary hydrocarbon group which may have a substituent, a tetrahydrofuranyl group, a tetrahydropyranyl group or an oxepanyl group; n denotes an integer of 1 to 3.

6. A process for fabricating a semiconductor, the process comprising the steps of applying the resin composition for photoresist according to any one of claims 1 to 5 to a base or a substrate to form a resist film, exposing, developing and thereby patterning the resist film.

* * * * *